(12) United States Patent
Lin et al.

(10) Patent No.: US 10,517,159 B2
(45) Date of Patent: Dec. 24, 2019

(54) CONTROL DEVICE

(71) Applicant: SHENZHEN ROYOLE TECHNOLOGIES CO., LTD., Guangdong (CN)

(72) Inventors: Qi Lin, Guangdong (CN); Songling Yang, Guangdong (CN); Xinyuan Xia, Guangdong (CN)

(73) Assignee: SHENZHEN ROYOLE TECHNOLOGIES CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 16/068,674

(22) PCT Filed: Apr. 15, 2016

(86) PCT No.: PCT/CN2016/079503
§ 371 (c)(1),
(2) Date: Jul. 8, 2018

(87) PCT Pub. No.: WO2017/177462
PCT Pub. Date: Oct. 19, 2017

(65) Prior Publication Data
US 2019/0029097 A1    Jan. 24, 2019

(51) Int. Cl.
*H05B 37/02* (2006.01)
*H03K 17/96* (2006.01)

(52) U.S. Cl.
CPC ......... *H05B 37/0245* (2013.01); *H03K 17/96* (2013.01)

(58) Field of Classification Search
CPC ............ H05B 37/0218; H05B 37/0245; H05B 37/0254; H05B 37/0281; H05B 37/0272; H05B 37/0227; H03K 17/96
See application file for complete search history.

(56) References Cited

U.S. PATENT DOCUMENTS

2016/0330327 A1\* 11/2016 Lee ................. H04L 12/12
2016/0378224 A1\* 12/2016 Kwon ............. H01L 51/5256
                                                            345/174
(Continued)

FOREIGN PATENT DOCUMENTS

CN          2812490       8/2006
CN       201057636 Y      5/2008
(Continued)

OTHER PUBLICATIONS

International Search Report for PCT/CN2016/079503 dated Jan. 18, 2017.
(Continued)

*Primary Examiner* — Douglas W Owens
*Assistant Examiner* — Syed M Kaiser
(74) *Attorney, Agent, or Firm* — IPro, PLLC; Na Xu

(57) ABSTRACT

A control device for controlling an electronic device includes: a switch, and a remote controller being operable to separate from or be in combination with the switch, wherein the switch and the remote controller each are configured to control the electronic device, and the remote controller is in combination with the switch when the control device is in a first usage state, or separates from the switch when the control device is in a second usage state.

20 Claims, 6 Drawing Sheets

(56) References Cited

U.S. PATENT DOCUMENTS

| | | | |
|---|---|---|---|
| 2017/0083268 A1* | 3/2017 | Cho | G06F 3/0346 |
| 2017/0187852 A1* | 6/2017 | Baek | H04M 1/0264 |
| 2017/0249919 A1* | 8/2017 | Bae | G09G 5/005 |
| 2017/0339770 A1* | 11/2017 | Kim | H04L 12/12 |
| 2017/0351486 A1* | 12/2017 | Won | G06F 3/013 |
| 2018/0095628 A1* | 4/2018 | Choi | G06F 3/1423 |
| 2018/0204350 A1* | 7/2018 | Cho | G06T 7/97 |

FOREIGN PATENT DOCUMENTS

| | | |
|---|---|---|
| CN | 102495559 A | 6/2012 |
| CN | 104053286 A | 9/2014 |
| CN | 205142574 U | 4/2016 |

OTHER PUBLICATIONS

Office Action received from the Patent Office of the People's Republic of China dated Dec. 26, 2018 for China Application No. 201680015804.6 (with English translation).

\* cited by examiner

CONTROL DEVICE

This application is a National Phase Application under 35 USC 371 of International Application No. PCT/CN2016/079503, filed Apr. 15, 2016, the entire contents of which are incorporated herein by reference.

FIELD

The present disclosure relates to a control device, and more particularly to a control device for a lamp.

BACKGROUND

A switch is generally connected with a lamp to turn on or off the lamp. Currently, with the progress of technology, some switches are further provided with a brightness adjusting function to meet diversified lighting needs. However, the switch of the existing lamp is usually fixed on the wall, when a user wants to turn on or off the lamp or adjust light of the lamp, he/she has to go near the switch to perform the corresponding operation, which is very inconvenient.

SUMMARY

Embodiments of the present disclosure provide a control device, which can be used conveniently.

In embodiments of the present disclosure, there is provided a control device for controlling an electronic device, the control device includes a switch and a remote controller being operable to separate from or be in combination with the switch, the switch and the remote controller each are configured to control the electronic device, and the remote controller is in combination with the switch when the control device is in a first usage state, or separates from the switch when the control device is in a second usage state.

BRIEF DESCRIPTION OF THE DRAWINGS

Drawings which will be involved in the following description of embodiments will be introduced below in brief for illustrating technical solutions in embodiments of the present disclosure more clearly, it will be appreciated that drawings described below are just some implementations of the present disclosure, and other modifications can also be obtained by those who skilled in the art, without creative work.

DETAILED DESCRIPTION

Figure 1:
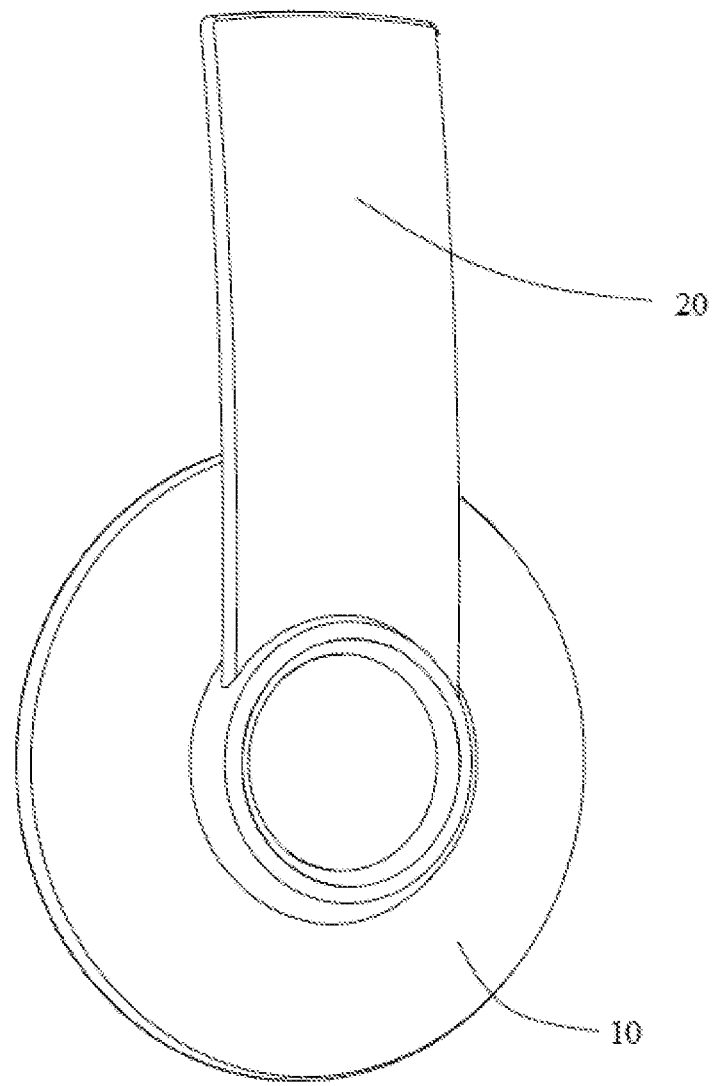
FIG. 1 is a schematic perspective view of a control device according to embodiments of the present disclosure.

In the following, embodiments of the present disclosure will be described clearly with reference to drawings.

In embodiments of the present disclosure, there is provided a control device for controlling an electronic device, the control device includes a switch and a remote controller being operable to separate from or be in combination with the switch, the switch and the remote controller each are configured to control the electronic device, and the remote controller is in combination with the switch when the control device is in a first usage state, or separates from the switch when the control device is in a second usage state.

In embodiments of the present disclosure, the switch includes a first touch sensitive surface and is configured to control the electronic device to switch among different operation modes according to different touching positions sensed by the first touch sensitive surface.

In embodiments of the present disclosure, the switch further includes a first light source for emitting light in a plurality of colors, and is configured to control the electronic device to switch to different operation modes according to different touching positions corresponding to different colors sensed by the first touch sensitive surface.

In embodiments of the present disclosure, the switch includes a base and a side wall connected with the base, the first light source is fixed to the base, and the first touch sensitive surface of the switch is on the side wall.

In embodiments of the present disclosure, light emitted by the first light source is transmitted to outside of the control device through the side wall and the first touch sensitive surface of the switch.

In embodiments of the present disclosure, the base has a controller received therein, and the controller is configured to control the electronic device to emit light in a color the same as a color obtained according to the first touch sensitive surface of the switch.

In embodiments of the present disclosure, the first light source is annular and surrounds the base, and light emitted by the first light source is transmitted through the side wall to project an aureole.

In embodiments of the present disclosure, the first ht source is located at a junction of the base and the side wall.

In embodiments of the present disclosure, the first touch sensitive surface of the switch surrounds the base.

In embodiments of the present disclosure, the base is opaque, and the side wall is light-transmissive.

In embodiments of the present disclosure, the remote controller includes a pedestal and a supporting element extending from the pedestal, and the pedestal is configured to connect to the base when the remote controller is in combination with the switch.

In embodiments of the present disclosure, the pedestal and the base are connected via magnetic attraction when the remote controller is in combination with the switch.

In embodiments of the present disclosure, a groove is defined in the base, and the groove accommodates the pedestal therein when the remote controller is in combination with the switch.

In embodiments of the present disclosure, the remote controller includes a second touch sensitive surface formed on the supporting element, and the remote controller is configured to control the electronic device to switch to different operation modes according to different touching gestures sensed by the second touch sensitive surface.

In embodiments of the present disclosure, the pedestal surrounds a through-hole, the switch includes a touch control surface on the base, and the touch control surface is exposed to the through-hole when the remote controller is in combination with the switch.

In embodiments of the present disclosure, the remote controller further includes a second light source in the pedestal, and light emitted by the second light source enters the through-hole.

In embodiments of the present disclosure, the second light source of the remote controller lights up when the remote controller is in combination with the switch and the electronic device is powered off.

In embodiments of the present disclosure, the base of the switch is provided with a proximity sensor configured to sense whether the remote controller is in combination with the switch and to control the second light source of the remote controller to turn on or off.

In embodiments of the present disclosure, a curvature of the second touch sensitive surface of the remote controller is greater than that of the first touch sensitive surface of the switch.

In embodiments of the present disclosure, the first touch sensitive surface of the switch and the second touch sensitive surface of the remote controller are formed by flexible touch panels.

A variety of control modes can be achieved by introducing the remote controller which can be in combination with or separated from the switch. The user may control the electronic device through the switch when he/she is near the switch, or through the remote controller when he/she is far from the control switch. As a consequence, the control device can be used more flexibly, thereby effectively increasing the convenience of control.

Figure 5:
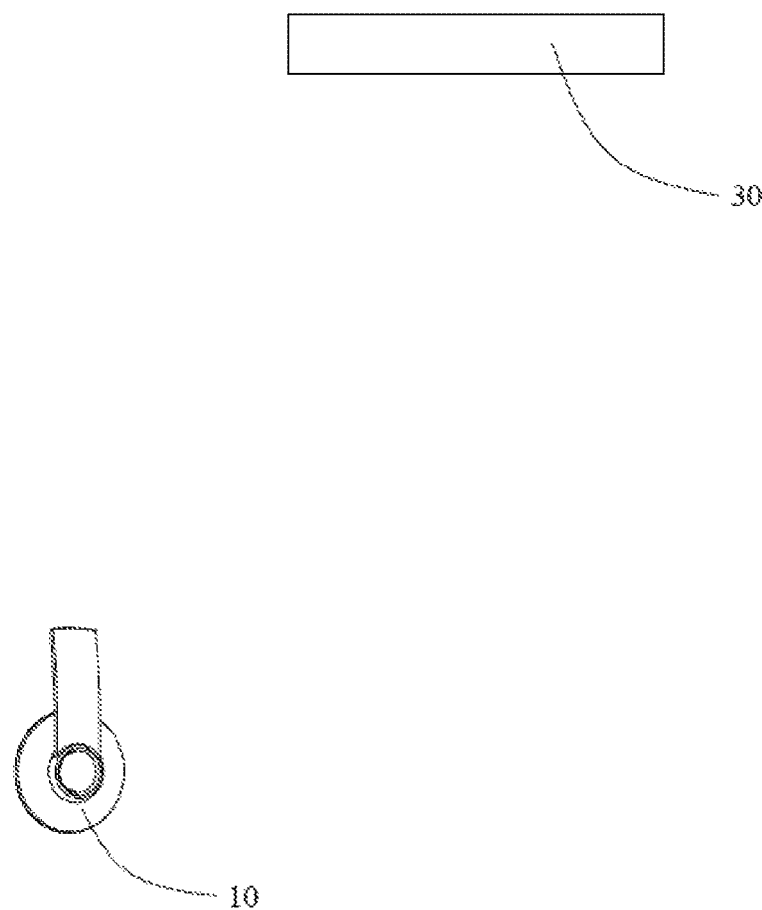
FIG. 5 is a schematic diagram of the control device shown in FIG. 1 in a usage state according to embodiments of the present disclosure.

Referring to FIG. 1 and FIG. 5, which illustrate a control device according to embodiments of the present disclosure, the control device includes a switch 10 and a remote controller 20. The switch 10 is configured to be fixed to a supporter, such as a wall. The remote controller 20 is detachably mounted on the switch 10. The switch 10 and the remote controller 20 each are capable of independently controlling an electronic device 30, such as a lamp, a television, an air conditioning, a sound box, a refrigerator, etc. In embodiments of the present disclosure, the electronic device 30 is a lamp.

Figure 3:
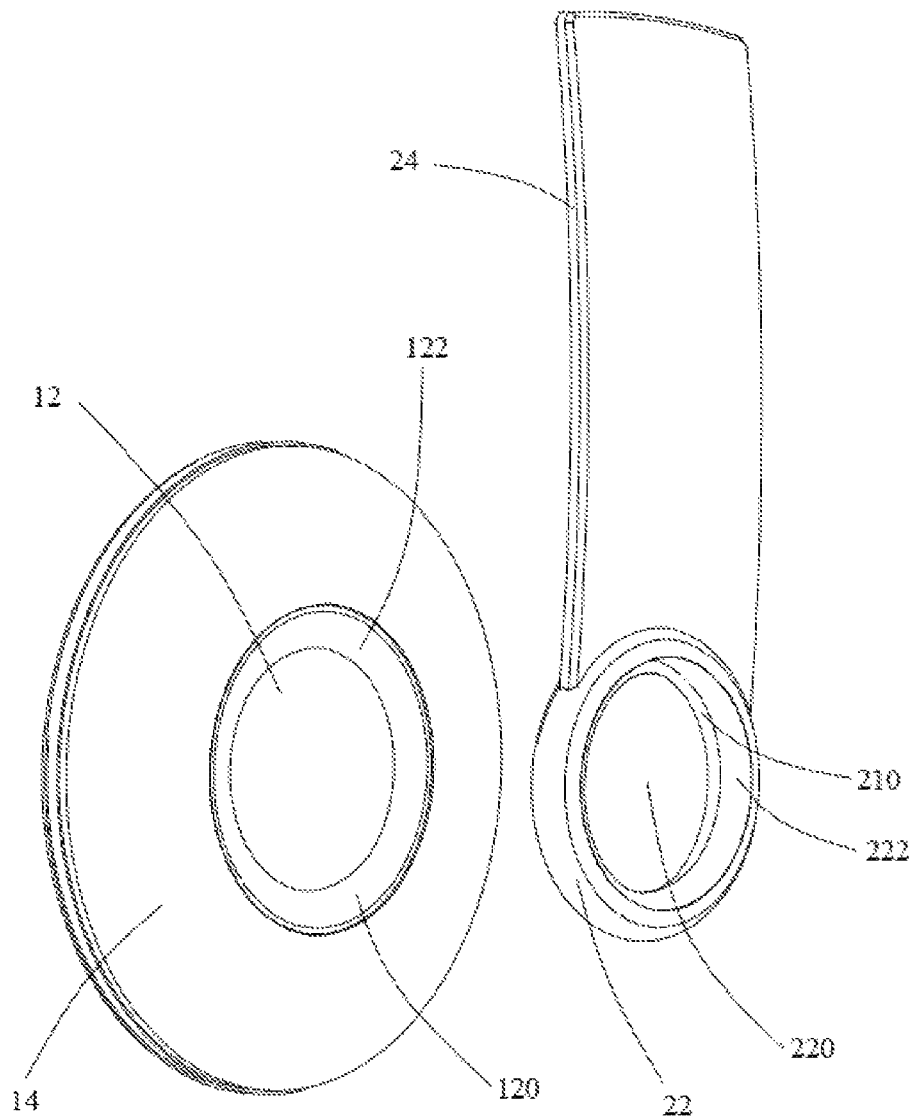
FIG. 3 is an explosive view of the control device shown in FIG. 1.
Figure 4:
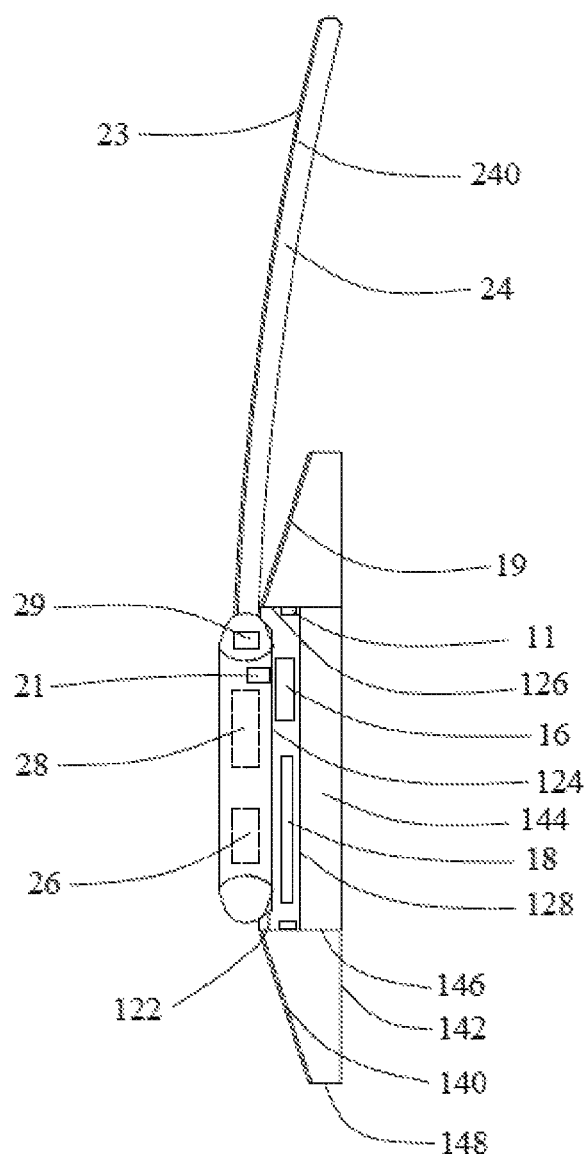
FIG. 4 is a sectional view of the control device shown in FIG. 1.

Further referring to FIGS. 3-4, the switch 10 includes a base 12 and a side wall 14 extending outwards from a periphery of the base 12. The base 12 is made of an opaque material, and the side wall 14 is made of a light-transmissive material. In embodiments of the present disclosure, the base 12 is made of a metal or a plastic, and the side wall 14 is made of an acrylic or a glass. The base 12 is roughly in a disc shape, a surface of which facing the remote controller 20 concaves inwards to form a groove 120 for accommodating the remote controller 20. An inner annular surface 122 of the groove 120 is an inclined plane, and its inner diameter gradually increases towards the remote controller 20, such that the groove 120 is in a pot shape. A bottom surface 124 of the groove 120 is a plane surface and is inclined relative to the inner annular surface 122. The base 12 is of a hollow structure and provided with a controller 16 and a power supply 18 therein to control the lamp. The bottom surface 124 of the groove 120 is a touch control surface, which is electrically connected with controller 16 and the power supply 18, and configured to sense a touching action from a user so as to control the lamp to turn on or off. The base 12 is further provided therein with a first light source 11 electrically connected with the controller 16 and the power supply 18. There are a plurality of the first light sources 11, and the plurality of the first light sources 11 are annularly arranged around an outer surface 126 of the base 12. The first light source 11 may be an LED, an OLED, a fluorescent lamp, a halogen lamp and so on. The first light sources 11 are located at a junction of the base 12 and the side wall 14. In embodiment of the present disclosure, a light-exiting surface of the first light source 11 is exposed at the outer surface 126 of the base 12. As a consequence, light emitted by the first light source 11 can pass through the base 12 and enter the side wall 14. Luminescence colors of the plurality of the first light sources 11 are different from one another, such that a colored annular light band is formed around the base 12. Certainly, in other embodiments of the present disclosure, the light-exiting surface of the first light source 11 may be located in the base 12, in such a case, an optical lens may be embedded in the base 12 at a position of the light-exiting surface of each first light source 11 to adjust the light of the first light sources 11 so as to enable the exited light to meet corresponding requirements. When the user turns on or off the lamp through the touch control surface, the first light source 11 is turned on or off synchronously.

Figure 2:
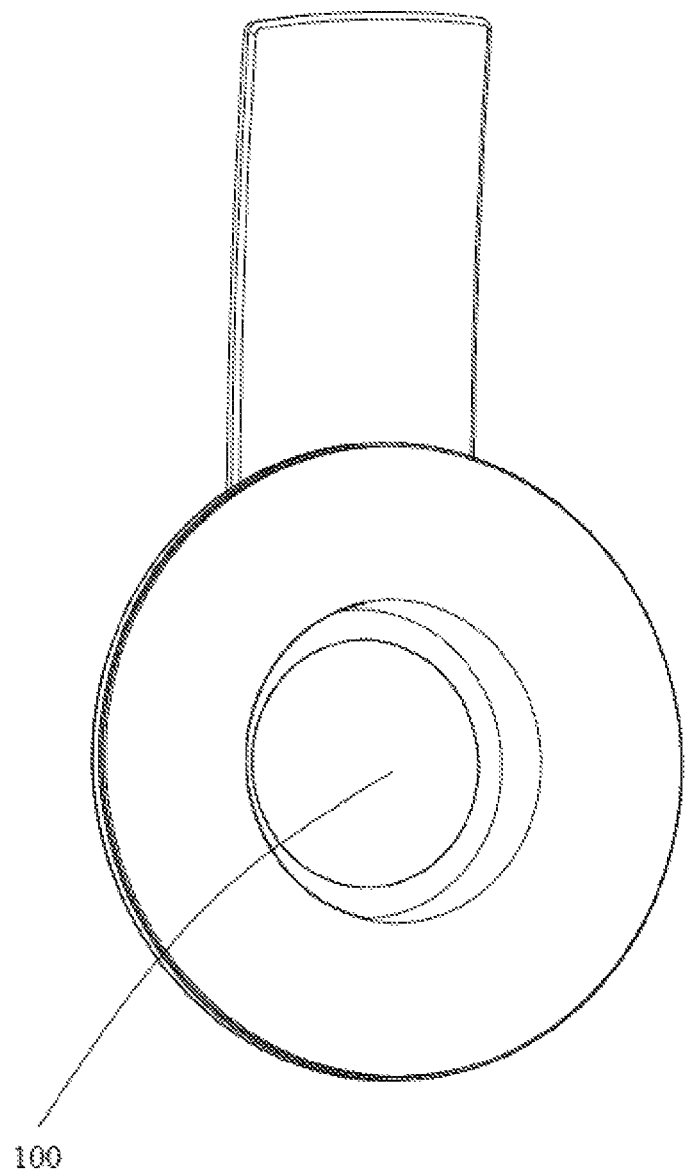
FIG. 2 is an inverted view of the control device shown in FIG. 1.

Further referring to FIG. 2, the side wall 14 surrounds the base 12 and is jointed with the outer surface 126 of the base 12. The side wall 14 is in an annular shape, and its thickness decreases gradually from inside to outside, such that an inclined front surface 140 and a flat back surface 142 are formed. A through-hole 144 is defined in a middle part of the side wall 14, and is configured to accommodate the base 12 therein. A thickness of the side wall 14 at an inner surface 146 thereof is greater than that of the base 12, when the base 12 is accommodated in the through-hole 144, a back surface 128 of the base 12 and the annular inner surface 146 of the side wall 14 together defines a circular recess 100. The power supply 18 and the controller 16 of the base 12 is connected with a corresponding configuration (such as a socket, a signal interface, etc.) of the supporter by a wire through the recess 100, so as to achieve power supply and signal transmission. As the side wall 14 is made of a transparent material, light exited from the base 12 passes through the inner surface 146, an outer surface 148 and the back surface 142 of the side wall 14 to reach to the supporter, such that a colored aureole is formed. Further, the front surface 140 of the side wall 14 is further provided with a touch sensitive element 19. In some embodiments of the present disclosure, the touch sensitive element 19 is a flexible touch panel, which is made of a transparent material. As the touch sensitive element 19 is flexible, it can be tightly attached to an inclined even curved surface, without affecting an overall appearance of the switch 10. The touch sensitive element 19 covers the front surface 140 of the side wall 14 to form a first touch sensitive surface of the switch 10. Light emitted by the first light sources 11 may be transmitted through the side wall 14 and the first touch sensitive surface directly or after reflected by the supporter. The touch sensitive element 19 is electrically connected with the controller 6 and the power supply 18, and is configured to sense the touch of the user, so as to adjust the color of the lamp. Specifically, as the first light sources 11 are in different colors, the aureole formed thereby also includes various different colors. If the user touches the touch sensitive element 19 at a position corresponding to a certain color of the aureole, the controller 16 will receive a touching signal containing position information, determine the color selected by the user according to the position information, and control the lamp to illuminate in the same color. For example, if the user touches the touch sensitive element 19 at a position corresponding to red color of the aureole, the lamp will illuminate in red color; and if the user touches the touch sensitive element 19 at a position corresponding to green color of the aureole, the lamp will illuminate in green color. As the light is adjusted by a visualized color selection, the color control of the lamp is simple, and the operations can be simplified effectively.

The remote controller 20 includes a pedestal 22 and a supporting element 24 connected with the pedestal 22. The pedestal 22 is made of an opaque material, and the supporting element 24 is made of a light-transmissive material. In embodiments of the present disclosure, the pedestal 22 is made of a metal or a plastic, and the supporting element 24 is made of an acrylic or a glass. The pedestal 22 is in an annular shape and provided with a controller 26, a power supply 28 and a wireless communication module 29 therein, and a circular through-hole 220 is defined by an inner surface 222 of the pedestal 22. The pedestal 22 may be accommodated in the groove 120 of the base 12, so as to achieve a combination of the remote controller 20 and the switch 10. As the presence of the through-hole 220 in a middle part of the pedestal 22, when the pedestal 22 is accommodated in the groove 120 of the base 12, the touch control surface of the base 12 is exposed to the through-hole 220, and the user can touch the touch control surface with his/her finger passing through the through-hole 220, so as to turn on or off the lamp normally. A detachable connection of the pedestal 22 and the base 12 can be achieved by a variety of ways, for example, the pedestal 22 and the base 12 are provided with a mutually mated hook and buckle, respectively; or the pedestal 22 and the base 12 are provided with a mutually fitted plug and hole, respectively. In embodiments of the present disclosure, the detachable connection of the pedestal 22 and the base 12 is achieved by means of magnetic attraction. The base 12 is provided with a magnetic element therein, such as a permanent magnet, an electromagnet, etc, and the pedestal 22 is also provided with a magnetic element therein, such as a permanent magnet, an electromagnet, iron, etc. As a consequence, the connection of the pedestal 22 and the base 12 is achieved by means of the magnetic attraction of the two magnetic elements. Certainly, if the pedestal 22 is made of a metal material per se, and can be attracted by a magnetic force, it is not necessary to provide the magnetic element therein. In embodiments of the present disclosure, the magnetic element in the base 12 is a magnetic generating element, and the magnetic element in the pedestal 22 is a magnetic conductivity element; certainly, the magnetic conductivity element may be disposed in the base 12, and the magnetic generating element is disposed in the pedestal 22. Further, the pedestal 22 is also provided with a second light source 21 electrically connected with the controller 26 and the power supply 28. A light-exiting surface of the second light source 21 is exposed to the inner surface 222 of the pedestal 22 to enable light emitted by the second light source 21 to enter the through-hole 220. In embodiments of the present disclosure, there are a plurality of the second light sources 21, and the plurality of the second light sources 21 are arranged around the inner surface 222 of the pedestal 22 to from an annular light band 210.

The supporting element 24 extends upwards from an end of the base 22, and is in a bent-plate shape with its curved front surface as a supporting surface 240. The supporting surface 240 is further provided with a touch sensitive element 23 thereon. In embodiments of the present disclosure, the touch sensitive element 23 is a flexible touch panel, which is made of a transparent material, and can be tightly attached to the curved supporting surface 240, so that the overall appearance of the supporting element 24 is more succinct. The touch sensitive element 23 constitutes a second touch sensitive surface of the remote controller 20, which can sense the touching action of the user, so as to adjust the light of the lamp. Specifically, the user may draw a gesture on the second touch sensitive surface, the touch sensitive element 23 identifies the touching gesture and sends a touching signal to the controller 26, and the controller 26 determines controlling information corresponding to the gesture according to the touching signal containing gesture information, and sends the controlling information to the lamp through the wireless communication module 29, so as to adjust the light of the lamp. For example, if the user draws a character R on the second touch sensitive surface, the controller 26 will control the lamp to illuminate in red color; if the user draws a character G on the second touch sensitive surface, the controller 26 will control the lamp to illuminate in green color; if the user slides with his/her finger on the second touch sensitive surface from upper to lower, the controller will control the lamp to darken; if the user slides with his/her finger on the second touch sensitive surface from lower to upper, the controller will control the lamp to brighten. In embodiments of the present disclosure, a curvature of the second touch sensitive surface of the remote controller 20 is greater than that of the first touch sensitive surface of the switch 10.

The remote controller 20 may be in combination with or separated from the switch 10 to achieve different purposes of use. Specifically, when the control device is in a first usage state, the remote controller 20 is in combination with the switch 10; when the control device is in a second usage state, the remote controller 20 is separated from the switch 10. The first usage state is applicable to a case that the user is near the switch 10, and the second usage state is applicable to a case that the user is far from the switch 10. Therefore, the user may control the lamp through the remote controller 20 when he/she is far from the switch 10, without necessary to go near the switch 10 to perform the corresponding operation, thereby making the control of the lamp more flexible and convenient.

Figure 6:
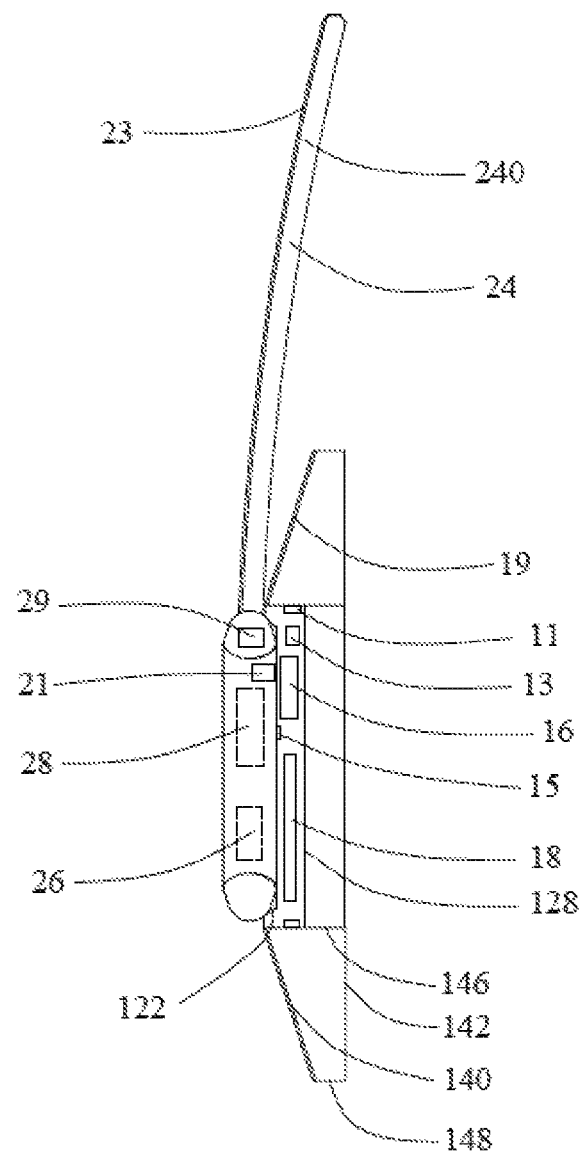
FIG. 6 is a sectional view of a control device according to other embodiments of the present disclosure.

Further, as shown in FIG. 6, the switch 10 is further provided with a wireless communication module 13 and a proximity sensor 15 to achieve the cooperation with the remote controller 20. When the remote controller 20 is in combination with the switch 10, the proximity sensor 15 may sense the proximity of the remote controller 20 and generate a proximity signal. When the user touches the touch control surface to turn off the lamp, the proximity sensor 15 will sense whether the remote controller 20 is in combination with the switch 10, if yes, the proximity sensor 15 will send a proximity signal to the controller 16, and the controller 16 feeds back a signal to the controller 26 of the remote controller 20 through the wireless communication module 13, so as to drive the light source 21 of the remote controller 20 to emit light. In such a case, the remote controller 20 acts as a night lamp, and the light source 21 provides a relatively weak illumination. When the lamp is turned on, if the proximity sensor 15 senses that the remote controller 20 is still in combination with the switch 10, the light source 21 of the remote controller 20 will be controlled to turn off. Thereby, effect of an automatic night lamp can be achieved. This night lamp mode is also applicable to the first usage state of the control device. Further, the first usage state further includes other usage modes, such as a remote controller loss-prevention mode, a remote controller charging mode (in this mode, the power supply 28 in the remote controller 20 is a rechargeable battery, and the switch 10 is provided with a wired or wireless charging module), a decorating mode and so on. Furthermore, both of the remote controller 20 and the switch 10 can work independently to control the lamp no matter in the first usage state or the second usage state.

The above embodiments are illustrated by taking the lamp as an example, where different color modes of the lamp are switched by choosing a corresponding color of the aureole. It will be appreciated that, when the electronic device 30 is in other types, different operation modes can also be switched by touching different positions corresponding to different colors. For example, when the electronic device 30 is a sound box, the sound box can be switched to a sound quality balance mode by touching a position corresponding to a red light, to a low pitch mode by touching a position corresponding to a green light, or to a high pitch mode by touching a position corresponding to a blue light. When the electronic device 30 is a television, the television can be switched to a game display mode by touching a position corresponding to a red light, to a movie display mode by touching a position corresponding to a green light, or to a cartoon display mode by touching a position corresponding to a blue light. Similarly, different operation modes can also be switched by making different gestures on the second touch sensitive surface of the remote controller 20.

What is claimed is:

1. A control device for controlling an electronic device, comprising:
    a switch; and
    a remote controller being operable to separate from or be in combination with the switch,
    wherein the switch and the remote controller each are configured to control the electronic device, and the remote controller is in combination with the switch when the control device is in a first usage state, or separates from the switch when the control device is in a second usage state;
    wherein the switch comprises a first touch sensitive surface, a first light source, a base and a side wall connected with the base, the first light source is fixed to the base, and the first touch sensitive surface of the switch is on the side wall.

2. The control device according to claim 1, wherein the switch is configured to control the electronic device to switch among different operation modes according to different touching positions sensed by the first touch sensitive surface.

3. The control device according to claim 2, wherein the first light source is configured to emit light in a plurality of colors, and the switch is configured to control the electronic device to switch to different operation modes according to different touching positions corresponding to different colors sensed by the first touch sensitive surface.

4. The control device according to claim 1, wherein light emitted by the first light source is transmitted to outside of the control device through the side wall and the first touch sensitive surface of the switch.

5. The control device according to claim 1, wherein the base has a controller received therein, and the controller is configured to control the electronic device to emit light in a color the same as a color obtained according to the first touch sensitive surface of the switch.

6. The control device according to claim 1, wherein the first light source is annular and surrounds the base, and light emitted by the first light source is transmitted through the side wall to project an aureole.

7. The control device according to claim 1, wherein the first light source is located at a junction of the base and the side wall.

8. The control device according to claim 1, wherein the first touch sensitive surface of the switch surrounds the base.

9. The control device according to claim 1, wherein the base is opaque, and the side wall is light-transmissive.

10. The control device according to claim 1, wherein the remote controller comprises a pedestal and a supporting element extending from the pedestal, and the pedestal is configured to connect to the base when the remote controller is in combination with the switch.

11. The control device according to claim 10, wherein the pedestal and the base are connected via magnetic attraction when the remote controller is in combination with the switch.

12. The control device according to claim 10, wherein a groove is defined in the base, and the groove accommodates the pedestal therein when the remote controller is in combination with the switch.

13. The control device according to claim 10, wherein the remote controller comprises a second touch sensitive surface formed on the supporting element, and the remote controller is configured to control the electronic device to switch to different operation modes according to different touching gestures sensed by the second touch sensitive surface.

14. The control device according to claim 10, wherein the pedestal surrounds a through-hole, the switch comprises a touch control surface on the base, and the touch control surface is exposed to the through-hole when the remote controller is in combination with the switch.

15. The control device according to claim 10, wherein the remote controller further comprises a second light source in the pedestal, and light emitted by the second light source enters the through-hole.

16. The control device according to claim 15, wherein the second light source of the remote controller lights up when the remote controller is in combination with the switch and the electronic device is powered off.

17. The control device according to claim 16, wherein the base of the switch is provided with a proximity sensor configured to sense whether the remote controller is in combination with the switch and to control the second light source of the remote controller to turn on or off.

18. The control device according to claim 13, wherein a curvature of the second touch sensitive surface of the remote controller is greater than that of the first touch sensitive surface of the switch.

19. The control device according to claim 13, wherein the first touch sensitive surface of the switch and the second touch sensitive surface of the remote controller are formed by flexible touch panels.

20. A control device for controlling an electronic device, comprising:
    a switch; and
    a remote controller being operable to separate from or be in combination with the switch,
    wherein the switch and the remote controller each are configured to control the electronic device, and the remote controller is in combination with the switch when the control device is in a first usage state, or separates from the switch when the control device is in a second usage state;
    wherein the switch and the remote controller each comprise a controller configured to control the electronic device.

* * * * *